US006909315B2

(12) United States Patent
Carnevale et al.

(10) Patent No.: US 6,909,315 B2
(45) Date of Patent: Jun. 21, 2005

(54) DATA STROBE SIGNALS (DQS) FOR HIGH SPEED DYNAMIC RANDOM ACCESS MEMORIES (DRAMS)

(75) Inventors: Michael Frank Carnevale, Rochester, MN (US); Paul Allen Ganfield, Rochester, MN (US); Daniel Frank Moertl, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 639 days.

(21) Appl. No.: 10/102,274

(22) Filed: Mar. 20, 2002

(65) Prior Publication Data

US 2003/0182595 A1 Sep. 25, 2003

(51) Int. Cl.[7] ............................................... H03H 11/26
(52) U.S. Cl. ...................................... 327/261; 327/276
(58) Field of Search ................................. 327/261, 263, 327/276, 277, 284; 713/400, 401, 500; 711/105

(56) References Cited

U.S. PATENT DOCUMENTS 6,467,043 B1 * 10/2002 LaBerge ..................... 713/401

6,529,993 B1 * 3/2003 Rogers et al. .............. 711/105

\* cited by examiner

Primary Examiner—Linh My Nguyen
(74) Attorney, Agent, or Firm—Moser, Patterson & Sheridan

(57) ABSTRACT

Embodiments are provided in which a method for delaying a strobe signal for a first pre-specified amount of time is described. A test signal is sent through a first number of delay books and a test is done as to whether it takes the test signal approximately a second pre-specified amount of time to pass the first number of delay books. Then, the number of delay books is increased or decreased by one at a time and until the number of delay books reaches a second number where it takes the test signal approximately the second pre-specified amount of time to pass the second number of delay books. From the second number, a third number of delay books is determined which is needed to cause a propagation delay approximately equal to the first pre-specified amount of time. Finally, the strobe signal is passed through the third number of delay books.

28 Claims, 5 Drawing Sheets

DATA STROBE SIGNALS (DQS) FOR HIGH SPEED DYNAMIC RANDOM ACCESS MEMORIES (DRAMS)

BACKGROUND OF THE INVENTION

1. Field of the Invention

The present invention generally relates to generating data strobe signals, and more particularly to generating data strobe signals for high speed dynamic random access memories (DRAMs).

2. Description of the Related Art

DRAMs are designed to change output data at a maximum speed of one output data per clock cycle. However, Double Data Rate (DDR) synchronous DRAMs (SDRAMs) can change output data at double that rate. Illustratively, at a rising edge of the clock, a DDR SDRAM can output a first data, and at the next falling edge of the clock, the DDR SDRAM can output a second data, and at the next rising edge of the clock, the DDR SDRAM can output a third data, and so on.

When a DDR SDRAM outputs new data, it also asserts a data strobe signal called a DQS signal. The DQS signal is aligned with the output data of the DDR SDRAM. Typically, the DDR SDRAM is coupled to an SDRAM interface which receives data and the DQS signal from the DDR SDRAM. The SDRAM interface may use the DQS signal from the DDR SDRAM as a clock signal that, when asserted, will trigger a data latch in the SDRAM interface to strobe data from the DDR SDRAM into the data latch. However, because it takes time for the data from the DDR SDRAM to stabilize at the input of the data latch, the DQS signal being asserted at the data latch does not guarantee that valid data are present at the input of the data latch in the SDRAM interface. Therefore, the DQS signal needs to be delayed by making the DQS signal go through a delay circuit so that when the data latch is triggered by the delayed asserted DQS signal, the data at the input of the data latch is stable and valid. If the delay circuit delays the asserted DQS signal too much, the data latch could capture invalid data or even data of the next memory cycle. If the delay circuit delays the asserted DQS signal too little, the data latch could capture invalid data or even data of the previous memory cycle. The goal is that when the asserted DQS signal reaches the data latch, the data from the DDR SDRAM at the input of the data latch is stable and valid. This goal may be achieved by ensuring that if the data from the DDR SDRAM starts to appear at the input of the data latch on a clock edge at time t1 and the next clock edge is at time t2, the delay circuit should cause the delayed asserted DQS signal to arrive at the data latch at approximately ½(t1+t2). On a timing diagram, this point of time is called the center of the data eye.

FIG. 1 shows a timing diagram of the clock signal, the DQS signal at the output of the DDR SDRAM, the data output of the DDR SDRAM at its own output, the delayed DQS signal at the input of the data latch, and the data output of the DDR SDRAM at the input of the data latch. The clock signal, the DQS signal, and the delayed DQS signal each have the same period. At a rising edge of the clock signal at time T1, the DDR SDRAM asserts a HIGH DQS signal and generates data output 10a. At time T2, the data output 10a reaches the data latch as data output 10b. The asserted HIGH DQS signal, after propagating through the delay circuit, reaches the data latch at time T3 as the delayed DQS signal. The delay circuit should delay the HIGH DQS signal such that time T3 is at the center of the data eye 10b.

At the next falling edge of the clock signal at time T4, the DDR SDRAM asserts a LOW DQS signal and generates data output 20a. At time T5, the data output 20a reaches the data latch as data output 20b. The LOW DQS signal, after propagating through the delay circuit, reaches the data latch at time T6 as the delayed DQS signal. The delay circuit should delay the LOW DQS signal such that time T6 is at the center of the data eye 20b. This sequence is repeated over time.

Designing a delay circuit capable of producing the desired delayed DQS signal is problematic. Fabrication process variations can make identical delay circuits to act differently on different chips and on different wafers. Differences in operating temperatures and operating voltages can cause identical delay circuits to yield different delays to the DQS signal. Moreover, differences in card wiring schemes can have different relative propagation paths for data and the respective DQS signal from the DDR SDRAM to the data latch. As a result, identical delay circuits in different card wiring schemes may cause the asserted DQS signal to reach the data latch at different locations with respect to the center of the respective data eye on a timing diagram.

Accordingly, there is a need for an apparatus and method in which a delay circuit will cause the asserted DQS signal to reach a data latch at a predetermined location with respect to the center of the respective data eye, even if the delay circuit is used in different operating temperatures, different operating voltages, and different card wiring schemes.

SUMMARY OF THE INVENTION

In one embodiment, a method is provided for delaying a strobe signal for a first pre-specified amount of time. The method comprises (a) providing a chain of delay books, (b) passing a test signal through a first subset of the delay books and determining whether it takes the test signal approximately a second pre-specified amount of time to pass the first subset, (c) changing the number of delay books in the first subset until it takes the test signal approximately the second pre-specified amount of time to pass the first subset, the final number of delay books in the first subset being M, (d) determining from the number M a number N of delay books in a second subset of the delay books needed to cause a propagation delay approximately equal to the first pre-specified amount of time, and (e) passing the strobe signal through the second subset.

In another embodiment, a digital system for delaying a strobe signal for a first pre-specified amount of time is described. The system comprises a chain of delay books and a delay sense circuit. The chain of delay books is configured to pass a test signal through a first subset of the delay books, and the delay sense circuit is configured to determine whether it takes the test signal approximately a second pre-specified amount of time to pass the first subset. The chain of delay books is further configured to (a) change the number of delay books in the first subset until it takes the test signal approximately the second pre-specified amount of time to pass the first subset, the final number of delay books in the first subset being M, (b) determine from the number M a number N of delay books in a second subset of the delay books needed to cause a propagation delay approximately equal to the first pre-specified amount of time, and (c) pass the strobe signal through the second subset.

In yet another embodiment, a method is provided for delaying a strobe signal for a first pre-specified amount of time. The method comprises (a) passing a test signal through a first number of delay books and determining whether it takes the test signal approximately a second pre-specified amount of time to pass the first number of delay books, (b) changing the number of delay books until the number of delay books reaches a second number where it takes the test signal approximately the second pre-specified amount of time to pass the second number of delay books, (c) determining from the second number a third number of delay books needed to cause a propagation delay approximately equal to the first pre-specified amount of time, and (d) passing the strobe signal through the third number of delay books.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Embodiments are provided in which a method for delaying a strobe signal for a first pre-specified amount of time is described. A test signal is sent through a first number of delay books and a test is done as to whether it takes the test signal approximately a second pre-specified amount of time to pass the first number of delay books. Then, the number of delay books is increased or decreased by one at a time and until the number of delay books reaches a second number where it takes the test signal approximately the second pre-specified amount of time to pass the second number of delay books. From the second number, a third number of delay books is determined which is needed to cause a propagation delay approximately equal to the first pre-specified amount of time. Finally, the strobe signal is passed through the third number of delay books.

Figure 1:
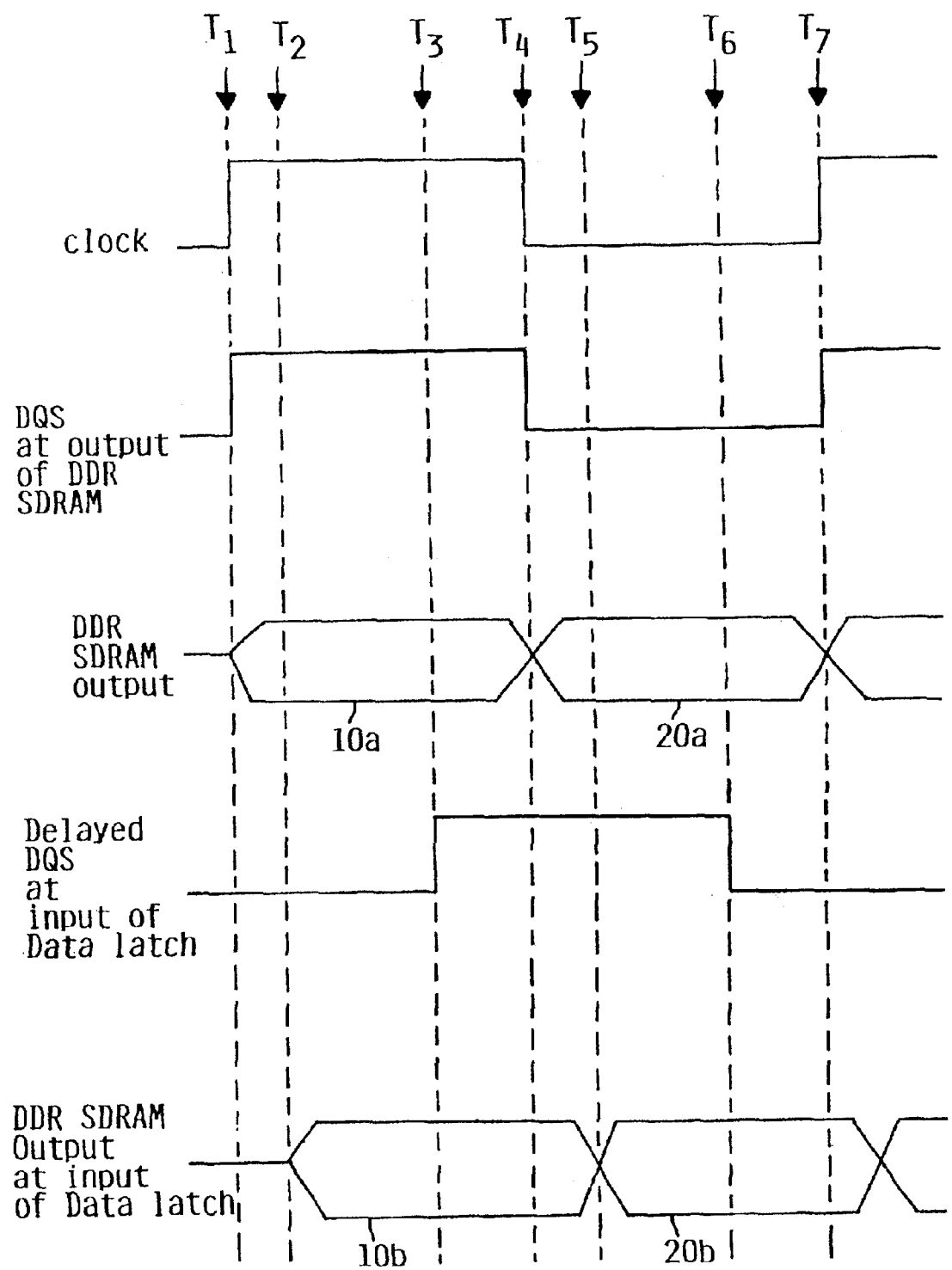
FIG. 1 shows a timing diagram of the signals involved in a typical DDR SDRAM.
Figure 2:
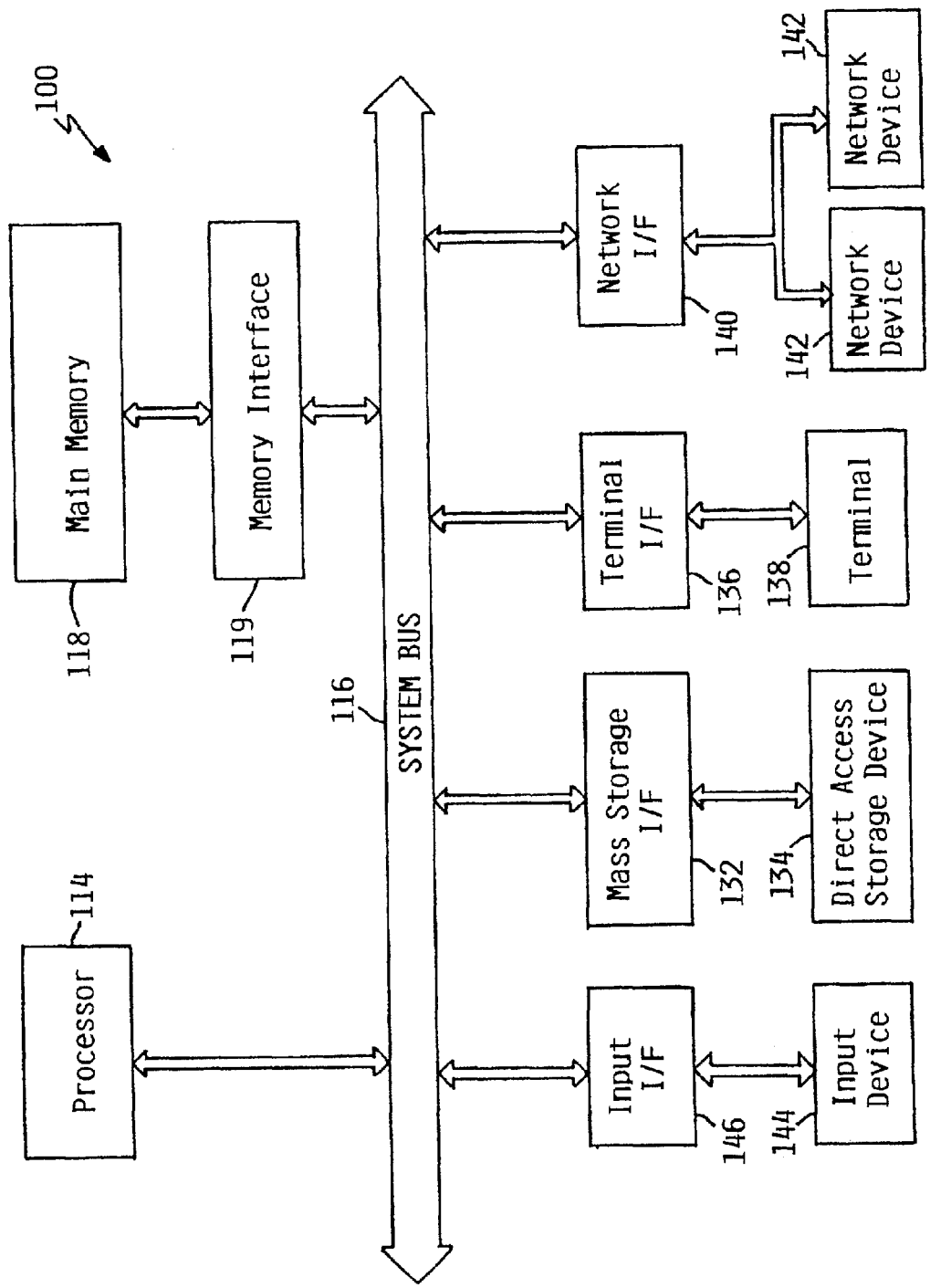
FIG. 2 is a computer system 100 according to an embodiment.

FIG. 2 is a computer system 100 according to an embodiment. Illustratively, the computer system 100 includes a system bus 116, at least a processor 114 coupled to the system bus 116. The computer system 100 also includes a main memory 118 coupled to the system bus 116 via a memory interface 119, an input device 144 coupled to system bus 116 via an input interface 146, a storage device 134 coupled to system bus 116 via a mass storage interface 132, a terminal 138 coupled to system bus 116 via a terminal interface 136, and a plurality of networked devices 142 coupled to system bus 116 via a network interface 140.

Terminal 138 is any display device such as a cathode ray tube (CRT) or a plasma screen. Terminal 138 and networked devices 142 may be desktop or PC-based computers, workstations, network terminals, or other networked computer systems. Input device 144 can be any device to give input to the computer system 100. For example, a keyboard, keypad, light pen, touch screen, button, mouse, track ball, or speech recognition unit could be used. Further, although shown separately from the input device, the terminal 138 and input device 144 could be combined. For example, a display screen with an integrated touch screen, a display with an integrated keyboard or a speech recognition unit combined with a text speech converter could be used.

Storage device 134 is DASD (Direct Access Storage Device), although it could be any other storage such as floppy disc drives or optical storage. Although storage 134 is shown as a single unit, it could be any combination of fixed and/or removable storage devices, such as fixed disc drives, floppy disc drives, tape drives, removable memory cards, or optical storage. Main memory 118 and storage device 134 could be part of one virtual address space spanning multiple primary and secondary storage devices.

The contents of main memory 118 can be loaded from and stored to the storage device 134 as the processor 114 has a need for it. Main memory 118 is any memory device sufficiently large to hold the necessary programming and data structures of the invention. The main memory 118 could be one or a combination of memory devices, including random access memory (RAM), non-volatile or backup memory such as programmable or flash memory or read-only memory (ROM). The main memory 118 may be physically located in another part of the computer system 100. While main memory 118 is shown as a single entity, it should be understood that memory 118 may in fact comprise a plurality of modules, and that main memory 118 may exist at multiple levels, from high speed to low speed memory devices.

Figure 3:
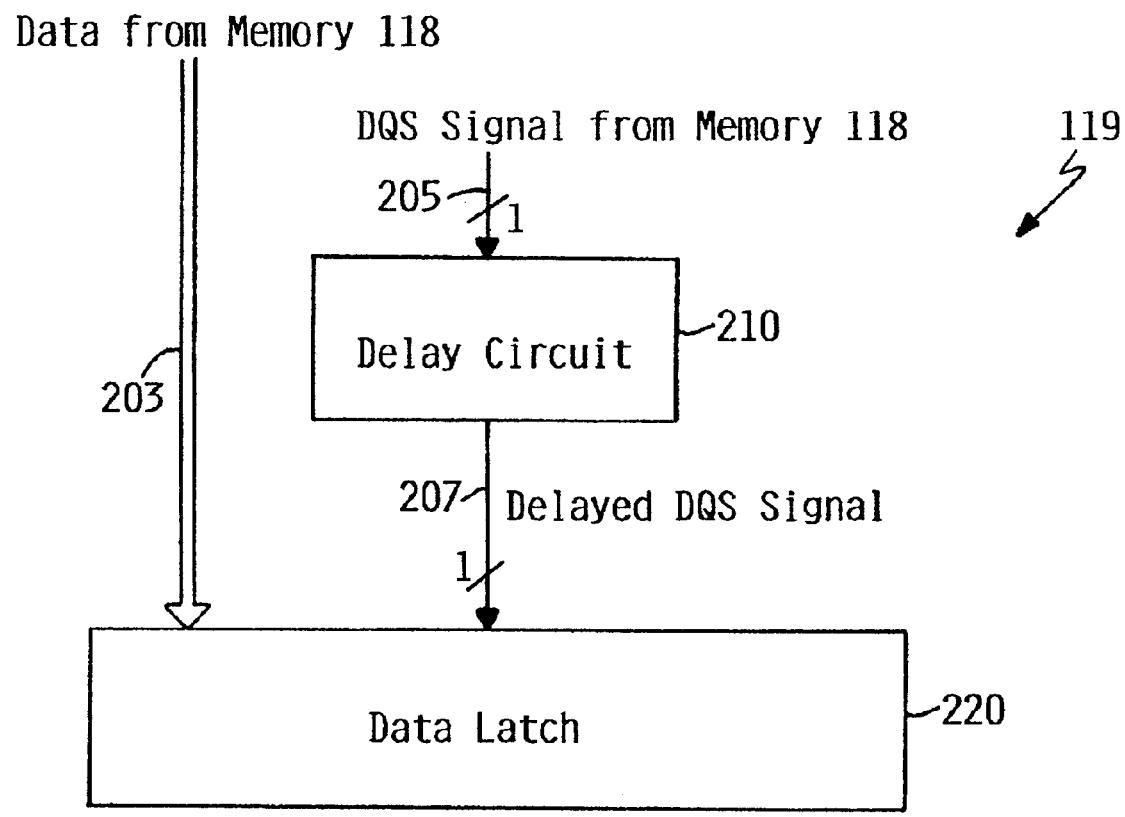
FIG. 3 shows an embodiment of the memory interface 119 of FIG. 2.

FIG. 3 shows an embodiment of the memory interface 119 of FIG. 2. Illustratively, the memory interface 119 includes a delay circuit 210 and a data latch 220. The delay circuit 210 receives as input a DQS signal from the main memory 118 via a connection 205. The delay circuit 210 generates as output a delayed DQS signal to the data latch 220 via a connection 207. The data latch 220 receives as input data from the main memory 118 via a connection 203. Any time the memory 118 outputs data on connection 203, the memory 118 also asserts the DQS signal on connection 205. The delay circuit 210 ensures that the asserted DQS signal on connection 205 is delayed such that when it reaches the data latch 220 as the delayed DQS signal, the data on connection 203 at the end of the data latch 220 is at approximately the center of the data eye. In other words, when the data latch 220 sees the delayed DQS asserted on connection 207, the data latch 220 has seen the respective data present on connection 203 for approximately half the memory cycle. The term "approximately" means that the arrival time of the asserted DQS signal at the data latch 220 should be sufficiently close to the center of the data eye that the data at the input of the data latch 220 is stable at the arrival time of the asserted DQS signal at the data latch 220. A memory cycle is the minimum time during which data remains on the output of the memory 118.

Figure 4A:
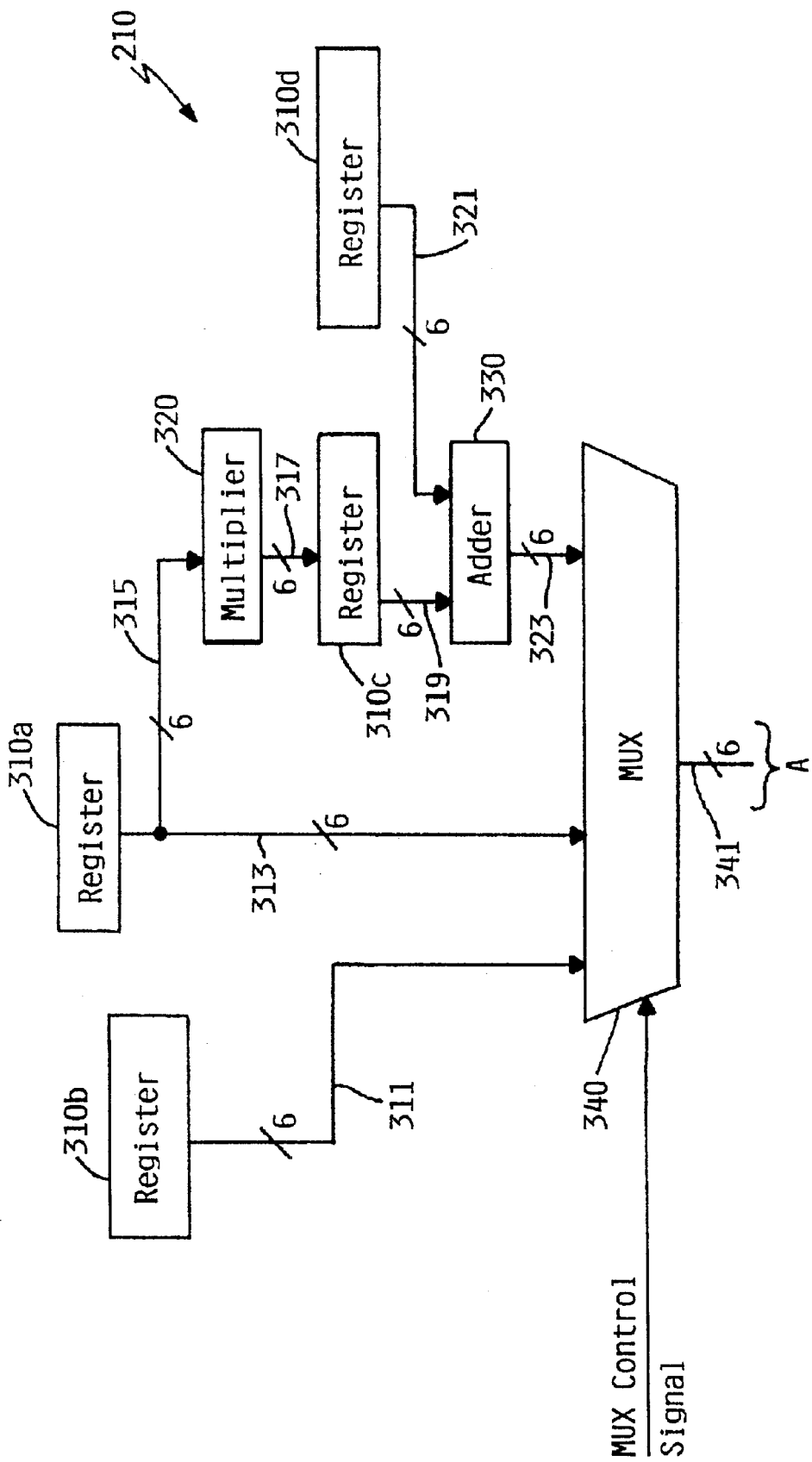
FIG. 4 shows an embodiment of the delay circuit 210 of FIG. 3.
Figure 4B:
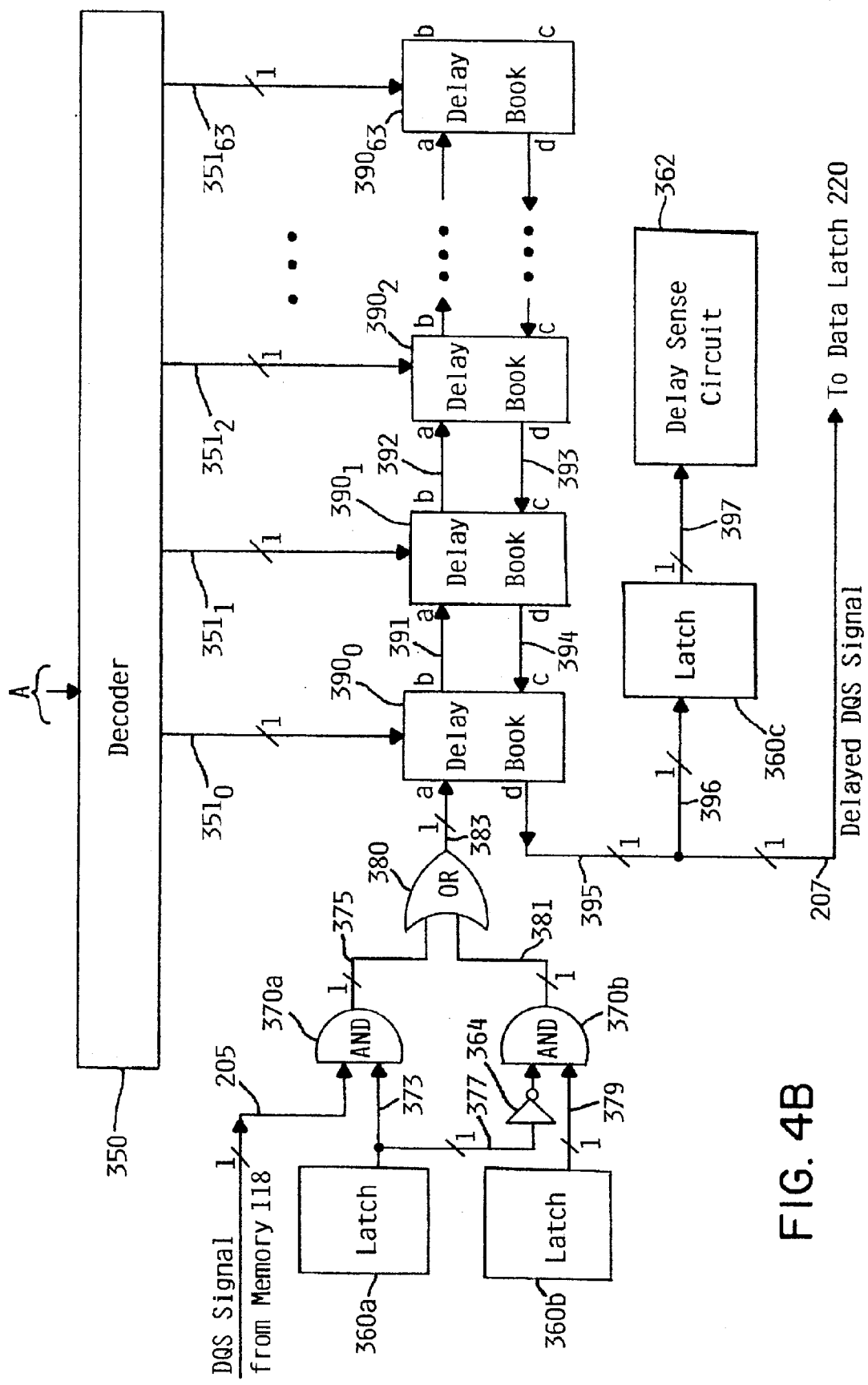

FIG. 4 shows an embodiment of the delay circuit 210 of FIG. 3. Illustratively, the delay circuit 210 includes registers 310$a$, 310$b$, 310$c$, and 310$d$ (collectively, the registers 310), a multiplier 320, an adder 330, a multiplexer (MUX) 340, a decoder 350, latches 360$a$, 360$b$, and 360$c$, an inverter 364, AND gates 370$a$ & 370$b$, an OR gate 380, 64 delay books 390$_0$, 390$_1$, ..., 390$_{63}$ in series (collectively, the delay books 390), and a delay sense circuit 362. In one embodiment, the delay books are identical. In another embodiment, there may be more or less than 64 delay books in the delay circuit 210.

For illustration of the operation of the delay circuit 210, assume that the memory 118 is a 200 MHz DDR SDRAM. As a result, a clock cycle is 1/200 MHz=5 ns. Because data output from the DDR SDRAM 118 can change twice in a clock cycle, a memory cycle is ½(5 ns)=2.5 ns. In other words, the width of a data eye is 2.5 ns. Assume further that the delay circuit 210 uses the same clock signal as that used by the memory 118. As a result, the delay circuit 210 also operates at 200 MHz.

When a refresh cycle for the memory 118 starts, the delay circuit 210 enters calibration mode. Illustratively, the register 310a is loaded with a value 000000b (b=binary) which is applied to the MUX 340 via a connection 313. Assume the registers 310 are all six bits wide to accommodate 64 delay books 390. In general, if there are $2^N$ delay books 390, the registers 310 should be N bits wide. A MUX control signal causes the MUX 340 to pass the value 000000b from the register 310a to the decoder 350 via a connection 341. In response, the decoder 350 activates only the delay book $390_0$ via a connection $351_0$ and keeps the remaining delay books 390 deactivated. In one embodiment, each of the delay books 390, when deactivated, provides a first conducting path with some propagation delay from point a to point b of the delay book 390, and a second conducting path with some propagation delay from point c to point d of the delay book 390. Each of the delay books 390, when activated, besides the first and second conducting paths, provides a third conducting path with negligible delay from point b to point c of the delay book 390.

In addition, the latch 360a is loaded with a 0b so that the inverter 364 generates a 1b to the AND gate 370b. As a result, the AND gate 370b is ready to pass a test signal (or calibration signal) from the latch 360b to the OR gate 380. At the next rising edge of the clock (hereafter, the first rising clock edge), the latch 360b is loaded with a 1b (one binary) as the test signal. As a result, the AND gate 370b passes the test signal from the latch 360b to the OR gate 380 and then to the chain of delay books 390 via a connection 383. With only the delay book $390_0$ being activated, the test signal from the latch 360b through the AND gate 370b and the OR gate 380, passes through the first, third, and then second paths of the delay book $390_0$ to the latch 360c via connections 395 & 396. In other words, with respect to the delay books 390, the test signal from the latch 360b passes from point a to point b, then to point c, and then to point d of the delay book $390_0$.

At the next rising edge of the clock (hereafter, the second rising clock edge) 5 ns after the first rising clock edge, the delay sense circuit 362 samples and tests the content of the latch 360c. Assume that the test signal from the latch 360b reaches the latch 360c before the second rising clock edge. As a result, the delay sense circuit 362 detects a 1b in the latch 360c. This indicates that, with the delay book $390_0$ being activated, the test signal propagates from the latch 360b to the latch 360c in less than 5 ns.

In response to detecting a 1b in the latch 360c, the delay sense circuit 362 causes the register 310a to be loaded with a value which is 1b more than the current value in register 310a. As a result, register 310a is loaded with a 000001b which is applied to the MUX 340 via connection 313. The MUX control signal causes the MUX 340 to pass the value 000001b from the register 310a to the decoder 350 via connection 341. In response, the decoder 350 activates only the delay book $390_1$ via a connection $351_1$ and keeps the remaining delay books 390 deactivated. The contents of the latches 360b & 360c are also cleared to 0b.

At the next rising edge of the clock (hereafter, the third rising clock edge), the latch 360b is loaded with a 1b as the test signal. As a result, the AND gate 370b passes the test signal of the latch 360b to the OR gate 380 and then to the chain of delay books 390 via connection 383. With only the delay book $390_1$ being activated, the test signal from the latch 360b through the AND gate 370b and the OR gate 380, passes through the first path of the delay book $390_0$, a connection 391, the first path of the delay book $390_1$, the third path of the delay book $390_1$, the second path of the delay book $390_1$, a connection 394, and then the second path of the delay book $390_0$, to the latch 360c via connections 395 & 396. In other words, with respect to the delay books 390, the test signal from the latch 360b passes from point a of the delay book $390_0$ to point b of the delay book $390_0$, through connection 391, to point a of the delay book $390_1$, to point b of the delay book $390_1$, to point c of the delay book $390_1$, to point d of the delay book $390_1$, through connection 394, to point c of the delay book $390_0$, and finally to point d of the delay book $390_0$. Assume the delay books 390 are identical, if a delay book 390 causes a delay time Td to the propagation of the test signal, the chain of delay books 390 cause a delay of 2 Td. This is because only two delay books $390_0$ and $390_1$ are on the propagation path of the test signal.

At the next rising edge of the clock (hereafter, the fourth rising clock edge) 5 ns after the third rising clock edge, the delay sense circuit 362 samples and tests the content of the latch 360c. Assume that the test signal from the latch 360b still reaches the latch 360c before the fourth rising clock edge. As a result, the delay sense circuit 362 detects a 1b in the latch 360c. This indicates that, with the delay book $390_1$ being activated, the test signal propagates from the latch 360b to the latch 360c in less than 5 ns.

The calibration process described above is repeated in which the delay book $390_2$ is now activated. A test signal of 1b is sent from the latch 360b to the latch 360c. The delay sense circuit 362 samples and tests the content of the latch 360c, and so on. Assume that when the delay book $390_{39}$ is activated, the delay sense circuit 362 still detects a 1b in the latch 360c. However, when the delay book $390_{40}$ is activated, the delay sense circuit 362 detects a 0b in the latch 360c. This indicates that, with the delay book $390_{40}$ being activated, the test signal propagates from the latch 360b to the latch 360c in more than 5 ns, which is the clock period. Assume further that the delay caused by the AND gate 370a and the OR gate 380 are negligible compared with the delay caused by the 41 delay books $390_0$, $390_1$, . . . , and $390_{40}$. As a result, the propagation delay Td caused by one delay book 390 can be estimated at 5/41 ns.

In one embodiment, the multiplier 320 receives as input the binary content of the register 310a via a connection 315. The multiplier 320 generates as output a binary value which is the binary content of the register 310a with the two least significant bits truncated (equivalent to dividing by four). In the example above, the content of the register 310a is 40d (decimal) or 101000b (binary). As a result, the multiplier 320 truncates the two least significant bits of 101000b and applies the result 1010b (10d) to the register 310c via a connection 317.

In one embodiment, the adder 330 adds the contents of the register 310c and the register 310d and applies the resulting sum to the MUX 340 via a connection 323. The content of the register 310c defines the final propagation path which the asserted DQS signal has to pass through. The content of the register 310d compensates for card wiring anomalies. If the path 203 for data and the path 205 for the DQS signal are substantially the same, firmware loads the register 310d with 000000b. If the path 203 for data is longer than the path 205 for the DQS signal, firmware loads the register 310d with a positive value to compensate for that length difference. If the path 203 for data is shorter than the path 205 for the DQS signal, firmware loads the register 310d with a negative value (in form of complement) to compensate for that length difference. With the delay sense circuit 362 detecting 0b in the latch 360c, the MUX control signal causes the MUX 340 to pass the resulting sum from the adder 330 to the decoder 350 via connection 341.

In one embodiment, the register 310d is loaded by firmware with 000000b. As a result, in the example above, the adder 330 adds 1010b and 0b and applies the resulting sum 1010b to the MUX 340 via a connection 323. With the delay sense circuit 362 detecting 0b in the latch 360c, the MUX control signal causes the MUX 340 to pass the resulting sum 1010b (10d) from the adder 330 to the decoder 350. As a result, the delay book $390_{10}$ is activated. Then, the latch 360a is loaded with a 1b so as to switch the delay circuit from calibrating mode to function mode.

In function mode, the latch 360a contains a 1b which is applied to the AND gate 370a. As a result, the AND gate 370a is ready to pass a DQS signal from the memory 118 to the data latch 220 via connection 205, connection 375, the OR gate 380, connection 383, a chain of delay books 390 including the activated delay book and the delay books to its left, connection 395, and connection 207. In the example above, assume at the next rising edge of the clock (hereafter, the fifth rising clock edge), the memory 118 sends data to the data latch 220 via connection 203 (FIG. 3). Also at the fifth rising clock edge, the memory 118 asserts the DQS signal on the connection 205 to the delay circuit 210. With the delay book $390_{10}$ being activated, the delay caused by the 11 delay books $390_0$, $390_1$, . . . , and $390_{10}$ can be estimated at 11×5/41 ns≈(¼) 5 ns which is also approximately the time it takes the asserted DQS to propagate from the memory 118 to the data latch 220. Because the memory 220 is a DDR SDRAM, the memory cycle is (½) 5 ns. Therefore, with a delay of (¼) 5 ns, the asserted DQS signal reaches the data latch 220 approximately one half of a memory cycle after the respective data reaches the data latch 220. In other words, the asserted DQS signal reaches the data latch 220 approximately at the center of the respective data eye.

In summary, the register 310a is used to keep track of the number of delay books 390 needed to cause a delay approximately equal to a clock cycle (5 ns). Because a memory cycle is (½) 5 ns, one half of memory cycle is (¼) 5 ns. As a result, the multiplier 320 is used to divide the content of the register 310a by four to yield the number of delay books needed to cause a delay approximately equal to one half of a memory cycle. This number of delay books is loaded into the register 310c. This number of delay books is further adjusted by the content of register 310d from firmware to compensate for card wiring anomalies. The final number of delay books is generated by the adder 330 to the MUX 340 and causes the decoder 350 to activate the proper delay book 390.

In one embodiment, the register 310d is loaded with a non-zero value to compensate for the card wiring anomalies. In the example above, assume that the connection 203 causes more propagation delay than the connection 205 (FIG. 3). The connection 207 is internal to the memory interface 119 and, therefore, is short and causes negligible delay compared to that caused by the connections 203 and 205. This assumption results in the data eye and its center moving to the right on a timing diagram with respect to the arrival time of the asserted DQS signal at the data latch 220. The register 310d should be loaded with a positive number by firmware to also make the arrival time of the asserted DQS signal at the data latch 220 move to the right the same amount of time on the timing diagram. As a result, the arrival time of the asserted DQS signal stays approximately at the center of the data eye. On one embodiment, the positive number which is loaded in to the register 310a is calculated based on the card wiring and timing analysis.

In the example above, assume card wiring and timing analysis shows that the propagation path 203 of data is longer than the propagation path 205 of the asserted DQS signal and, as a result, one more delay book 390 needs to be added to the propagation path of the DQS signal to compensate for this length difference. As a result, firmware loads a positive number 1b into the register 310d. The adder 330 adds 1010b from register 310c and 1b from register 310d and applies the resulting sum 1011b to the MUX 340 via a connection 323. The MUX control signal causes the MUX 340 to pass the resulting sum 1011b (11d) from the adder 330 to the decoder 350. As a result, the delay book $390_{11}$ is activated. Compared with the case in which the register 310d is loaded with 0b, the delay caused by the chain of delay books 390 is increased by Td. As a result, the arrival time of the asserted DQS signal is moved to the right on the timing diagram by an amount of Td. This helps keep the arrival time of the asserted DQS signal at the data latch 220 stay approximately at the center of the data eye.

In the example above, assume alternatively that the connection 203 causes less propagation delay than the connection 205 (FIG. 3). This alternative assumption results in the data eye and its center moving to the left on the timing diagram with respect to the arrival time of the asserted DQS signal at the data latch 220. The register 310d should be loaded with a negative number (complement) by firmware to also make the arrival time of the asserted DQS signal at the data latch 220 move to the left the same amount of time on the timing diagram. As a result, the arrival time of the asserted DQS signal stays approximately at the center of the data eye. On one embodiment, the negative number which is loaded in to the register 310a is calculated based on the card wiring and timing analysis.

In the example above, assume alternatively that card wiring and timing analysis shows the propagation path 203 of data is shorter than the propagation path 205 of the asserted DQS signal and, as a result, one delay book 390 needs to be taken out of the propagation path of the DQS signal to compensate for this length difference. As a result, firmware loads a negative number −1b (i.e., 111111b, if two-complement is used) which is loaded into the register 310d to compensate for this length difference. The adder 330 adds 1010b from register 310c and −1b from register 310d and applies the resulting sum 1001b (9d) to the MUX 340 via a connection 323. The MUX control signal causes the MUX 340 to pass the resulting sum 1001b (9d) from the adder 330 to the decoder 350. As a result, the delay book $390_9$ is activated. Compared with the case in which the register 310d is loaded with 0b, the delay caused by the chain of delay books 390 is decreased by Td. As a result, the arrival time of the asserted DQS signal at the data latch 220 is moved to the left on the timing diagram by an amount of Td. This helps keep the arrival time of the asserted DQS signal at the data latch 220 stay approximately at the center of the data eye.

In one embodiment, the register 310b is loaded with a spare value provided by firmware. This spare value is used to provide a proper delay to the asserted DQS signal in the case the delay circuit 210 malfunctions in calibration mode. The spare value is calculated based on card wiring and timing analysis and stored in firmware. During initialization of the system 100, if testing indicates that the delay circuit 210 malfunctions, the register 310b is loaded with the spare value. The MUX control signal is set to cause the MUX 340 to pass the spare value from the register 310b to the decoder 350 to activate a corresponding delay book 390. In the example above, assume that, during initialization of system 100, the delay circuit 210 is found malfunctioning in calibration mode and a spare value of 11d is loaded by firmware into the register 310b. The spare value 11d is applied to the MUX 340 via connection 311. The MUX control signal is set to cause the MUX 340 to pass the spare value 11d from the register 310b to the decoder 350 to activate a corresponding delay book $390_{11}$. As a result, any time the memory 118 sends data and respective DQS signal to the data latch 210, the DQS signal is delayed by 12 Td to keep its arrival time at the data latch 220 approximately at the center of the respective data eye.

In one embodiment, the multiplier 320 is configured to multiply the content of the register 310a with a fractional constant (less than one). As a result, the arrival time of the asserted DQS signal at the data latch 220 can be located at any desired location in the respective data eye. In the example above, assume that timing analysis indicates the arrival time of the asserted DQS signal at the data latch 220 should be at $2/3$ of the respective data eye. Because the memory 118 is a DDR SDRAM, the needed delay should be $(2/3)*$ memory cycle=$(2/3)*[(1/2)$ 5 ns]=$(1/3)$ 5 ns. As a result, the fractional constant should be $1/3$. The resulting product from the multiplier 320 is $(40d)*(1/3)\approx13d$ which is applied to the register 310c. If the register 310d contains a 0b, the MUX control signal causes the MUX 340 to pass the resulting sum 13d from the adder 330 to the decoder 350. As a result, the delay book $390_{13}$ is activated. The delay cased by the 14 delay books $390_0, 390_1, \ldots,$ and $390_{13}$ is $14*Td=14*(5/41$ ns$)\approx(1/3)*5$ ns. Because the data eye is $(1/2)*5$ ns wide, the arrival time of the asserted DQS signal at the data latch 220 is at approximately $[(1/3)*5$ ns$]/[(1/2)*5$ ns$]=2/3$ of the data eye, which is expected.

In one embodiment, when the delay circuit 210 enters calibrating mode, the delay book $390_{63}$ is activated and a test signal is sent from the latch 360b to the latch 360c via the chain of all 64 delay books 390. The delay books 390 are designed such that all 64 delay books 390 cause sufficient delay for the test signal not to reach the latch 360c in one clock cycle (5 ns in the example above). However, the delay books 390 are also designed such that one delay book 390 does not cause sufficient delay to prevent the test signal from reaching the latch 360c in one clock cycle (5 ns in the example above). As a result, the delay sense circuit 362 does not detect the test signal in the latch 360c. Next, the delay book $390_{62}$ is activated and a test signal is sent from the latch 360b to the latch 360c via the chain of 63 delay books $390_0, 390_1, \ldots,$ and $390_{62}$. The delay sense circuit 362 samples the content of the latch 360c for the test signal from the latch 360b. This calibration process is continued until the delay sense circuit 362 detects the test signal in the latch 360c. As a result, the number of delay books 390 needed to yield a propagation delay equal to the clock period can be determined. Then, the number of delay books 390 needed to yield a propagation delay equal to one half of the width of the respective data eye (which is also one half of memory cycle) can be determined.

In the example above, the delay sense circuit 362 does not detect the test signal (a 1b) in the latch 360c when the delay book $390_{40}$ is activated, but should detect the test signal in the latch 360c when the delay book $390_{39}$ is later activated. As a result, 40 delay books 390 is needed to yield a propagation delay equal to the clock period 5 ns. The register 310a should hold this value of 39d. Because the memory 118 is a DDR SDRAM, its data eye is 2.5 ns wide ($1/2$ of the clock period). Therefore, to yield a propagation delay equal to one half of the width of the data eye (1.25 ns), ($1/4$) 40=10 delay books 390 are needed. The multiplier 320 is designed to make this determination by dividing the content of the register 310a by four (39d/4≈9d) and sending the result (9d) to the register 310c. As a result, 10 delay books 390 are included on the propagation path of the asserted DQS signal and this ensures the arrival time of the asserted DQS signal is approximately at the center of the respective data eye.

In one embodiment, refresh cycles for the memory 118 are performed every 31.33 μs. As a result, the calibration process described above is also performed every 31.33 μs. Therefore, operating voltage and temperature change will be instantaneously accounted for.

In summary, the registers 310a, 310c, and 310d, the multiplier 320, and the adder 330 implement a simple multiply-add delay function: $m*X+b$, where m is a positive coefficient less than 1, X is the width of the clock cycle in term of delay books, and b is an adjustment constant to compensate for card wiring anomalies. The multiplier 320 implements $m*X$ and the adder 330 implements the addition of $m*X$ and b. The unit of X and b is delay books. In the illustrations above and in FIG. 4, X=40 delay books. If it is desired that the asserted DQS reach the data latch 220 at approximately the center of the respective data eye, coefficient m should be $1/4$. Similarly, if it is desired that the asserted DQS reach the data latch 220 at approximately $2/3$ of the respective data eye, m should be $1/3$. Coefficient m may be hardwired into the multiplier 320 or programmed by firmware into the multiplier 320 during system initialization. Adjustment constant b can be loaded into the register 310d by firmware during system initialization. As a result, there is no need for any timing information concerning the time delay effect of operating temperature, operating voltage, and fabrication variations.

While the foregoing is directed to embodiments of the present invention, other and further embodiments of the invention may be devised without departing from the basic scope thereof, and the scope thereof is determined by the claims that follow.

What is claimed is:

1. A method for delaying a strobe signal for a first pre-specified amount of time, the method comprising:
   providing a chain of delay books;
   passing a test signal through a first subset of the delay books and determining whether it takes the test signal approximately a second pre-specified amount of time to pass the first subset;
   changing the number of delay books in the first subset until it takes the test signal approximately the second pre-specified amount of time to pass the first subset, the final number of delay books in the first subset being M;
   determining from the number M a number N of delay books in a second subset of the delay books needed to cause a propagation delay approximately equal to the first pre-specified amount of time; and
   passing the strobe signal through the second subset.

2. The method of claim 1, wherein determining from the number M the number N of delay books in the second subset of the delay books needed to cause the propagation delay approximately equal to the first pre-specified amount of time comprises using a multiply-add circuit to determine N according to the formula $N=m*M+b$, wherein m is a positive coefficient less than one and b is a constant.

3. The method of claim 1, wherein changing the number of delay books in the first subset until it takes the test signal approximately the second pre-specified amount of time to pass the first subset comprises changing by one delay book at a time.

4. The method of claim 1, wherein the first pre-specified amount of time is less than the second pre-specified amount of time.

5. The method of claim 4, wherein determining from the number M the number N of delay books in the second subset of the delay books needed to cause the propagation delay approximately equal to the first pre-specified amount of time comprises multiplying, with a multiplier, the number M with a fractional constant to yield the number N.

6. The method of claim 1, wherein passing the test signal through the first subset of the delay books comprises:

activating a first delay book in the chain; and passing the test signal through the first subset, wherein the first subset includes consecutive delay books starting at an end of the chain and ending at the first delay book.

7. The method of claim 6, wherein changing the number of delay books in the first subset comprises:

activating a second delay book in the chain adjacent to the first delay book; and passing the test signal through the second subset, wherein the second subset includes consecutive delay books starting at the end of the chain and ending at the second delay book.

8. The method of claim 7, wherein activating the first delay book in the chain comprises using a content of a register to cause a decoder to activate the first delay book.

9. The method of claim 8, wherein activating the second delay book in the chain adjacent to the first delay book comprises:

changing a content of the register by one; and using the content of the register to cause the decoder to activate the second delay book.

10. The method of claim 9, wherein determining from the number M the number N of delay books in the second subset of the delay books needed to cause the propagation delay approximately equal to the first pre-specified amount of time comprises truncating at least one least significant bit of a content of the register to yield the number N.

11. The method of claim 9, wherein determining from the number M the number N of delay books in the second subset of the delay books needed to cause the propagation delay approximately equal to the first pre-specified amount of time comprises multiplying, with a multiplier, a content of the register with a first constant to yield the number N, the first constant being related to the number M.

12. The method of claim 11, further comprising using an adder to add a second constant to the product of the content of the register and the first constant to yield the number N.

13. The method of claim 11, wherein passing the strobe signal through the second subset comprises:

using the number N to cause the decoder to activate a third delay book in the chain; and passing the strobe signal through the second subset, wherein the second subset includes consecutive delay books starting at the end of the chain and ending at the third delay book.

14. A digital system for delaying a strobe signal for a first pre-specified amount of time, the system comprising a chain of delay books and a delay sense circuit, wherein the chain of delay books is configured to pass a test signal through a first subset of the delay books, and the delay sense circuit is configured to determine whether it takes the test signal approximately a second pre-specified amount of time to pass the first subset; and the chain of delay books is further configured to change the number of delay books in the first subset until it takes the test signal approximately the second pre-specified amount of time to pass the first subset, the final number of delay books in the first subset being M;

determine from the number M a number N of delay books in a second subset of the delay books needed to cause a propagation delay approximately equal to the first pre-specified amount of time; and pass the strobe signal through the second subset.

15. The system of claim 14, wherein the chain of delay books is further configured to change the number of delay books in the first subset by one delay book at a time.

16. The system of claim 14, wherein the first pre-specified amount of time is less than the second pre-specified amount of time.

17. The system of claim 16, further comprising a multiplier configured to multiply the number M with a fractional constant to yield the number N.

18. The system of claim 14, wherein the chain of delay books is further configured to:

activate a first delay book in the chain; and pass the test signal through the first subset, wherein the first subset includes consecutive delay books starting at an end of the chain and ending at the first delay book.

19. The system of claim 18, wherein the chain of delay books is further configured to:

activate a second delay book in the chain adjacent to the first delay book; and pass the test signal through the second subset, wherein the second subset includes consecutive delay books starting at the end of the chain and ending at the second delay book.

20. The system of claim 19, further comprising a register and a decoder, wherein the decoder is configured to activate the first delay book in the chain based on a content of the register.

21. The system of claim 20, wherein the system is configured to change a content of the register by one; and the decoder is configured to activate the second delay book in the chain based on a content of the register.

22. The system of claim 21, further comprising a multiplier configured to truncate at least one least significant bit of a content of the register to yield the number N.

23. The system of claim 21, further comprising a multiplier configured to multiply a content of the register with a first constant to yield the number N, the first constant being related to the number M.

24. The system of claim 23, further comprising an adder configured to add a second constant to the product of the content of the register and the first constant to yield the number N.

25. The system of claim 23, wherein the decoder is further configured to activate a third delay book in the chain; and the chain of delay books is further configured to pass the strobe signal through the second subset, wherein the second subset includes consecutive delay books starting at the end of the chain and ending at the third delay book.

26. A method for delaying a strobe signal for a first pre-specified amount of time, the method comprising:

passing a test signal through a first number of delay books and determining whether it takes the test signal approximately a second pre-specified amount of time to pass the first number of delay books;

changing the number of delay books until the number of delay books reaches a second number where it takes the test signal approximately the second pre-specified amount of time to pass the second number of delay books;

determining from the second number a third number of delay books needed to cause a propagation delay approximately equal to the first pre-specified amount of time; and passing the strobe signal through the third number of delay books.

27. The method of claim 26, wherein changing the number of delay books comprises changing by one delay book at a time away from the first number.

28. The method of claim 26, wherein the first pre-specified amount of time is less than the second pre-specified amount of time.

* * * * *

UNITED STATES PATENT AND TRADEMARK OFFICE
CERTIFICATE OF CORRECTION

PATENT NO. : 6,909,315 B2
DATED : June 21, 2005
INVENTOR(S) : Michael Joseph Carnevale et al.

It is certified that error appears in the above-identified patent and that said Letters Patent is hereby corrected as shown below:

<u>Title page,</u>
Item [75], Inventors, please change the first inventor name to -- Michael Joseph Carnevale --.

Signed and Sealed this

Eighth Day of November, 2005

JON W. DUDAS
*Director of the United States Patent and Trademark Office*